(12) United States Patent
Tokuno et al.

(10) Patent No.: US 9,692,052 B2
(45) Date of Patent: Jun. 27, 2017

(54) ELECTRODE MATERIAL FOR BATTERY, ELECTRODE MATERIAL PASTE FOR BATTERY, AND SOLAR CELL USING SAME, STORAGE BATTERY, AND METHOD FOR MANUFACTURING SOLAR CELL

(71) Applicants: Kabushiki Kaisha Toshiba, Tokyo (JP); Toshiba Materials Co., Ltd., Yokohama-shi (JP)

(72) Inventors: Yoko Tokuno, Tokyo (JP); Tomomichi Naka, Kanagawa-ken (JP); Naoaki Sakurai, Kanagawa-ken (JP); Akito Sasaki, Kanagawa-ken (JP); Shuzi Hayase, Fukuoka-ken (JP)

(73) Assignees: Kabushiki Kaisha Toshiba, Tokyo (JP); Toshiba Materials Co., Ltd., Yokohama-shi (JP)

( * ) Notice: Subject to any disclaimer, the term of this patent is extended or adjusted under 35 U.S.C. 154(b) by 463 days.

(21) Appl. No.: 13/792,340

(22) Filed: Mar. 11, 2013

(65) Prior Publication Data

US 2013/0244092 A1    Sep. 19, 2013

(30) Foreign Application Priority Data

Mar. 13, 2012 (JP) ................. 2012-056422

(51) Int. Cl.

| | |
|---|---|
| *H01M 4/48* | (2010.01) |
| *H01L 31/0224* | (2006.01) |
| *H01G 9/20* | (2006.01) |
| *H01M 4/66* | (2006.01) |
| *H01M 4/36* | (2006.01) |

(52) U.S. Cl.
CPC ............ *H01M 4/48* (2013.01); *H01G 9/2027* (2013.01); *H01L 31/022425* (2013.01); *H01M 4/366* (2013.01); *H01M 4/66* (2013.01); *H01G 9/2059* (2013.01); *Y02E 10/542* (2013.01); *Y02P 70/521* (2015.11); *Y10T 428/2982* (2015.01)

(58) Field of Classification Search
None
See application file for complete search history.

(56) References Cited

U.S. PATENT DOCUMENTS

| | | | |
|---|---|---|---|
| 6,541,697 B1 | 4/2003 | Georg et al. | |
| 2007/0107775 A1* | 5/2007 | Choi | ............ H01G 9/2031 136/263 |
| 2010/0282308 A1* | 11/2010 | Okamoto | ............ 136/255 |

FOREIGN PATENT DOCUMENTS

| | | |
|---|---|---|
| CN | 1910713 A | 2/2007 |
| CN | 101765942 A | 6/2010 |
| JP | 2003-500815 A | 1/2003 |

(Continued)

OTHER PUBLICATIONS

Machine Translation of Sato (JP 2009283429 A).*

(Continued)

*Primary Examiner* — Patrick Ryan
*Assistant Examiner* — Haixia Zhang
(74) *Attorney, Agent, or Firm* — Oblon, McClelland, Maier & Neustadt, L.L.P.

(57) ABSTRACT

According to one embodiment, an electrode material for a battery includes a tungsten oxide powder or a tungsten oxide composite powder provided with a coating unit containing at least one selected from a metal oxide, silicon oxide, a metal nitride, and silicon nitride.

2 Claims, 4 Drawing Sheets

(56) References Cited

FOREIGN PATENT DOCUMENTS

| JP | 2009-135025 | 6/2009 |
|---|---|---|
| JP | 2009-283429 A | 12/2009 |
| JP | 2011-91012 A | 5/2011 |
| JP | 2011-154988 | 8/2011 |

OTHER PUBLICATIONS

Notification of Reason(s) for Refusal issued Apr. 18, 2014 in Japanese Patent Application No. 2012-056422 (with English translation).

Combined Office Action and Search Report issued Sep. 1, 2015 in Chinese Patent Application No. 201310075221.0 (with English language translation).

\* cited by examiner

ELECTRODE MATERIAL FOR BATTERY, ELECTRODE MATERIAL PASTE FOR BATTERY, AND SOLAR CELL USING SAME, STORAGE BATTERY, AND METHOD FOR MANUFACTURING SOLAR CELL

CROSS-REFERENCE TO RELATED APPLICATIONS

This application is based upon and claims the benefit of priority from the prior Japanese Patent Application No. 2012-056422, filed on Mar. 13, 2012; the entire contents of which are incorporated herein by reference.

FIELD

Embodiments described herein relate generally to an electrode material for battery, electrode material paste for battery, and solar cell using same, storage battery, and method for manufacturing solar cell.

BACKGROUND

There is a solar cell in which an electrolytic solution is enclosed between electrodes. For example, there is a dye-sensitized solar cell in which an electrode in which porous bodies made of titanium oxide or the like are loaded with a sensitizing dye (also called a photosensitizing dye) and an electrolytic solution are enclosed between a pair of substrates.

In order to improve the mechanical strength of the porous body made of titanium oxide and the adhesion between porous bodies, an oxide layer with high hardness may be provided on the porous body. It is reported that an electrode using a titanium oxide powder provides a certain level of power generation efficiency (JP-A 2011-154988; Patent Document 1).

In typical solar cells such as silicon-based solar cells, the power generation efficiency depends on the amount of sunlight applied. Therefore, the electricity output rapidly decreases when there is a sudden change in the weather.

To address such a problem, JP-A 2009-135025 (Patent Document 2) proposes providing a solid electricity storage layer on a titanium oxide layer. However, forming a two-layered structure with the solid electricity storage layer by itself has made only a limited contribution to improving the power generation efficiency and the electricity storage capability.

DETAILED DESCRIPTION

In general, according to one embodiment, an electrode material for a battery includes a tungsten oxide powder or a tungsten oxide composite powder provided with a coating unit containing at least one selected from a metal oxide, silicon oxide, a metal nitride, and silicon nitride.

In general, according to another embodiment, an electrode material for a battery includes a tungsten oxide powder or a tungsten oxide composite powder with a BET surface area of 5 $m^2/g$ or more.

In general, according to another embodiment, an electrode material paste for a battery comprising one of: an electrode material for a battery including a tungsten oxide powder or a tungsten oxide composite powder provided with a coating unit containing at least one selected from a metal oxide, silicon oxide, a metal nitride, and silicon nitride, and an electrode material for a battery including a tungsten oxide powder or a tungsten oxide composite powder with a BET surface area of 5 $m^2/g$ or more.

In general, according to another embodiment, a solar cell includes: a first substrate; a second substrate provided to face the first substrate; a first electrode provided on a side facing the second substrate of the first substrate; a second electrode provided on a side facing the first substrate of the second substrate; a sealing unit provided between the first substrate and the second substrate and sealing a peripheral portion of the first substrate and a peripheral portion of the second substrate; and an electrolytic solution provided inside the sealing unit, the second electrode including: a base containing tungsten oxide or a tungsten oxide composite; a supporter provided on the base and containing at least one of a metal oxide, silicon oxide, a metal nitride, and silicon nitride; and a sensitizing dye loaded on the supporter.

In general, according to another embodiment, a method for manufacturing a solar cell including: a first substrate; a second substrate provided to face the first substrate; a first electrode provided on a side facing the second substrate of the first substrate; a second electrode provided on a side facing the first substrate of the second substrate; a sealing unit provided between the first substrate and the second substrate and sealing a peripheral portion of the first substrate and a peripheral portion of the second substrate; and an electrolytic solution provided inside the sealing unit, the method includes: providing the second electrode on a side facing the first substrate of the second substrate, the providing the second electrode including: forming a base containing tungsten oxide or a tungsten oxide composite; forming a supporter containing at least one of a metal oxide, silicon oxide, a metal nitride, and silicon nitride on the base; and loading the supporter with a sensitizing dye.

In general, according to another embodiment, a storage battery includes: a first substrate; a second substrate provided to face the first substrate; a first electrode provided on a side facing the second substrate of the first substrate; a second electrode provided on a side facing the first substrate of the second substrate; a sealing unit provided between the first substrate and the second substrate and sealing a peripheral portion of the first substrate and a peripheral portion of the second substrate; and an electrolytic solution provided inside the sealing unit, the second electrode including: a base containing tungsten oxide or a tungsten oxide composite; and a supporter provided on the base and containing at least one of a metal oxide, silicon oxide, a metal nitride, and silicon nitride.

Hereinbelow, embodiments are illustrated with reference to the drawings. In the drawings, like components are marked with the same reference numerals, and a detailed description is omitted as appropriate.

First Embodiment

First, an electrode material for a battery is described.

An electrode material for a battery according to a first embodiment includes a tungsten oxide powder or a tungsten oxide composite powder provided with a coating unit containing at least one selected from a metal oxide, silicon oxide, a metal nitride, and silicon nitride.

The tungsten oxide is preferably tungsten trioxide ($WO_3$). The tungsten oxide composite may be, for example, tungsten oxide containing an element such as N, Ti, Mn, Fe, Pd, Pt, Cu, Ag, Al, and Ce in an amount of approximately 0.01 mass % to 2 mass %. However, the element contained in the tungsten oxide is not limited to those illustrated but may be changed as appropriate.

The tungsten oxide powder or the tungsten oxide composite powder preferably has a BET surface area of 5 $m^2/g$ or more. If the BET surface area is as small as less than 5 $m^2/g$, the contact area between the tungsten oxide powder and a sensitizing dye or an electrolytic solution is reduced, and this may lead to insufficient improvement in the power generation efficiency and the electricity storage function. Therefore, the BET specific surface area is preferably 15 $m^2/g$ or more. The upper limit of the BET surface area is not particularly limited, but 150 $m^2/g$ or more is preferable in view of manufacturability.

The coating unit contains at least one selected from a metal oxide, silicon oxide, a metal nitride, and silicon nitride. Examples of the metal used for the metal oxide or the metal nitride include a rare earth element, Ti, Zn, Sn, Zr, Mg, Al, Bi, Mn, Ta, Nb, and the like. The coating unit may be formed on part or the whole of the surface of the tungsten oxide powder.

By being provided with the coating unit, the tungsten oxide powder can be improved in the reduction in oxygen deficiency, the reduction in the reverse transfer of electrons, the adhesion to a transparent electrode (necking properties), the adsorbability of a dye, etc. The coating unit preferably contains at least one selected from the group consisting of $Y_2O_3$, $TiO_2$, ZnO, $SnO_2$, $ZrO_2$, MgO, $Al_2O_3$, $CeO_2$, $Tm_2O_3$, $Bi_2O_3$, $Mn_3O_4$, $Ta_2O_5$, $Nb_2O_5$, $La_2O_3$, and ITO. When the coating unit is a metal oxide, it is easy to obtain the effect of reducing oxygen deficiency.

The tungsten oxide powder with a BET surface area of 5 $m^2/g$ or more, further 15 $m^2/g$ or more is preferably manufactured by a method using plasma treatment. Since plasma treatment is a method using high-temperature combustion flame, a tungsten oxide powder in which oxygen deficiency partially exists may be formed. If oxygen deficiency exists, an unnecessary band gap is formed in the tungsten oxide powder, and consequently reverse transfer of electrons is likely to occur. If reverse transfer of electrons occurs, electrons cannot be accumulated in the semiconductor layer, and therefore the electricity storage effect is reduced.

In view of this, the tungsten oxide powder obtained by plasma treatment preferably undergoes heat treatment at 300 to 1000° C. in an oxygen-containing atmosphere to reduce oxygen deficiency and homogenize the powder. The combustion flame used for the plasma treatment is preferably 8000° C. or more, more preferably 10,000° C. or more.

The thickness of the coating unit is preferably 10 nm or less, more preferably 2 nm or less. The tungsten oxide powder serves to store electricity and conduct electricity as a semiconductor layer. When a metal oxide or silicon oxide like the above is used as the coating unit, oxygen deficiency can be reduced; but if the film thickness is too thick, insulation is increased to make it difficult to extract electrons from the tungsten oxide powder. Hence, when a metal oxide or silicon oxide is used as the coating unit, the film thickness is preferably 10 nm or less, more preferably 2 nm or less. Also when a material other than an oxide, such as a metal nitride and silicon nitride, is used as the coating unit, the film thickness is preferably 10 nm or less, more preferably 2 nm or less in view of the ease of extracting electrons. The lower limit of the film thickness is not particularly limited, but 0.5 nm or more is preferable.

The coating unit may be formed on part or the whole of the surface of the tungsten oxide powder. When it is attempted to reduce oxygen deficiency, reduce the reverse transfer of electrons, and improve the adsorbability of the dye, the coating unit does not necessarily need to be formed on the entire surface of the tungsten oxide powder, and it is sufficient to be formed on part of the surface.

Methods for forming the coating unit include coating the tungsten oxide powder using the physical vapor deposition (PVD) method such as the sol-gel method, the vacuum deposition method, and the sputtering method, various chemical vapor deposition (CVD) methods, or the like. For example, when a $Y_2O_3$ coating is formed using the sol-gel method, a method is given in which the tungsten oxide power is immersed in an yttrium nitrate aqueous solution to load the surface of the tungsten oxide powder with yttrium nitrate and then heat treatment is performed to convert the yttrium nitrate into yttrium oxide ($Y_2O_3$). In the sputtering method, an oxide film or a nitride film can be formed by putting oxygen or nitrogen, respectively, in the sputtering atmosphere.

As described later, the coating unit may be formed using the sol-gel method after a semiconductor layer made of a tungsten oxide powder is formed.

The electrode material for a battery like the above has a certain level of power generation efficiency or electricity storage effect, and is therefore effective as an electrode material for a solar cell or for a storage battery.

Second Embodiment

Next, an electrode material paste for a battery is described.

An electrode material paste for a battery according to a second embodiment will now be described. The paste contains the electrode material for a battery of the first embodiment, a binder, and a solvent. Assuming that the total amount of the electrode material for a battery, the binder, and the solvent is 100 wt %, the amount of the electrode material for a battery is preferably in a range of 5 to 50 wt %, and the amount of the binder is preferably in a range of 3 to 30 wt %. In these ranges, it is easy to adjust the viscosity (25° C.) of the paste to a range of 800 to 10,000 cps. When the paste viscosity is 800 to 10,000 cps, it is easy to form a semiconductor layer by coating technique such as the printing method.

The binder is preferably an organic binder having a pyrolysis rate at 500° C. of 99.0% or more. When the binder can be pyrolized at a temperature of 500° C. or less, a glass substrate etc. can be prevented from being damaged. As such a binder, an organic binder such as ethyl cellulose and polyethylene glycol is given. As the solvent, an alcohol, an organic solvent, pure water, etc. are given. Of these, an alcohol-based solvent is preferable.

In the mixing process, the binder and the solvent are mixed beforehand and a stirring process is performed. Next, it is preferable to put in the electrode material for a battery and stir the mixture. If the electrode material for a battery and the binder are put into the solvent at one time, a paste containing a large amount of aggregate is likely to be formed.

Third Embodiment

Figure 1:
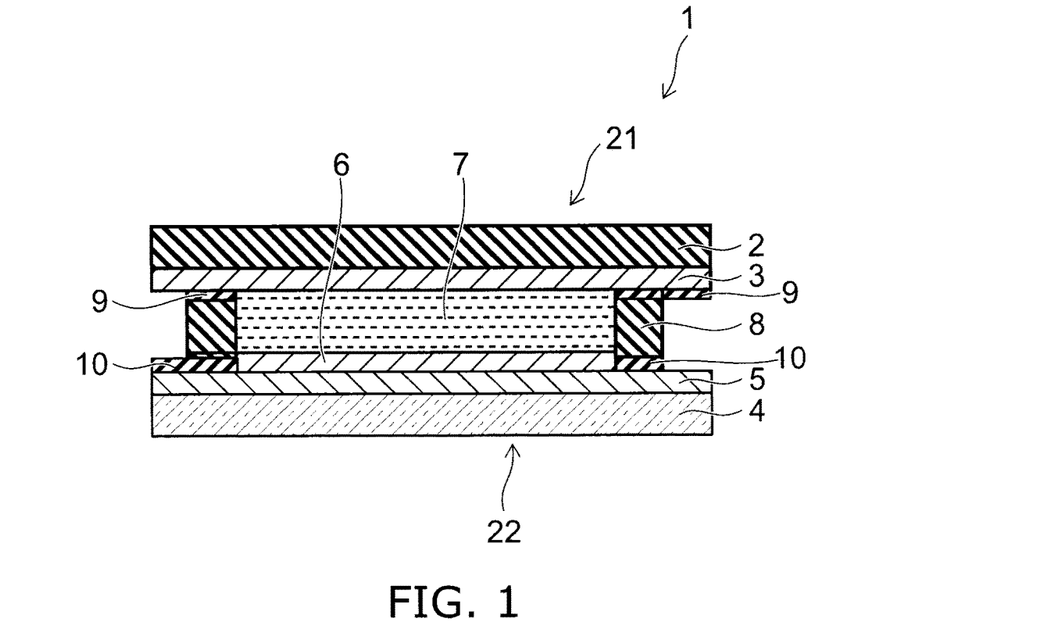
FIG. 1 is a schematic cross-sectional view for illustrating a solar cell (a dye-sensitized solar cell) according to a third embodiment.

FIG. 1 is a schematic cross-sectional view for illustrating a solar cell (a dye-sensitized solar cell) according to a third embodiment.

As shown in FIG. 1, a solar cell 1 includes a counter electrode unit 21, a photoelectrode unit 22, an electrolytic solution 7, and a sealing unit 8.

The counter electrode unit 21 includes a first substrate 2, a first electrode 3, and a first bonding unit 9. The photoelectrode unit 22 includes a second substrate 4, a transparent electrode 5, a second electrode 6, and a second bonding unit 10.

The first substrate 2 may have resistance to the heat generated in performing sealing described later, chemical resistance to the electrolytic solution 7, etc.

The second substrate 4 is configured to have light transmissivity, but the first substrate 2 may be either transmissive or non-transmissive to light.

Hence, the first substrate 2 may be formed using, for example, a metal such as aluminum and stainless steel, a resin, a ceramic, glass, or the like. The first substrate 2 may be formed also using the same material as the second substrate 4 having light transmissivity.

The first electrode 3 is shaped like a film, and is provided on a major surface of the first substrate 2 on the side facing the second substrate 4.

The first electrode 3 has electrical conductivity, and may have the heat resistance, the chemical resistance, etc. described above.

The transparent electrode 5 is configured to have light transmissitivy, but the first electrode 3 may be either transmissive or non-transmissive to light.

Hence, the first electrode 3 may be formed using, for example, a metal such as platinum, gold, silver, copper, and aluminum, carbon, a conductive polymer, ITO (indium tin oxide), or the like. The first electrode 3 may be formed also using the same material as the transparent electrode 5 having light transmissivity.

The second substrate 4 is provided to face the first substrate 2.

The second substrate 4 has light transmissivity, and may have the heat resistance, the chemical resistance, etc. described above.

The second substrate 4 may be formed using, for example, glass or the like.

The transparent electrode 5 is shaped like a film, and is provided on a major surface of the second substrate 4 on the side facing the first substrate 2.

The transparent electrode 5 may have light transmissivity, electrical conductivity, heat resistance, chemical resistance, etc.

The transparent electrode 5 may be formed using, for example, ITO, IZO (indium zinc oxide), FTO (fluorine-doped tin oxide), $SnO_2$, $InO_3$, or the like.

The second electrode 6 is provided on the side facing the first substrate 2 of the second substrate 4.

Figure 2:
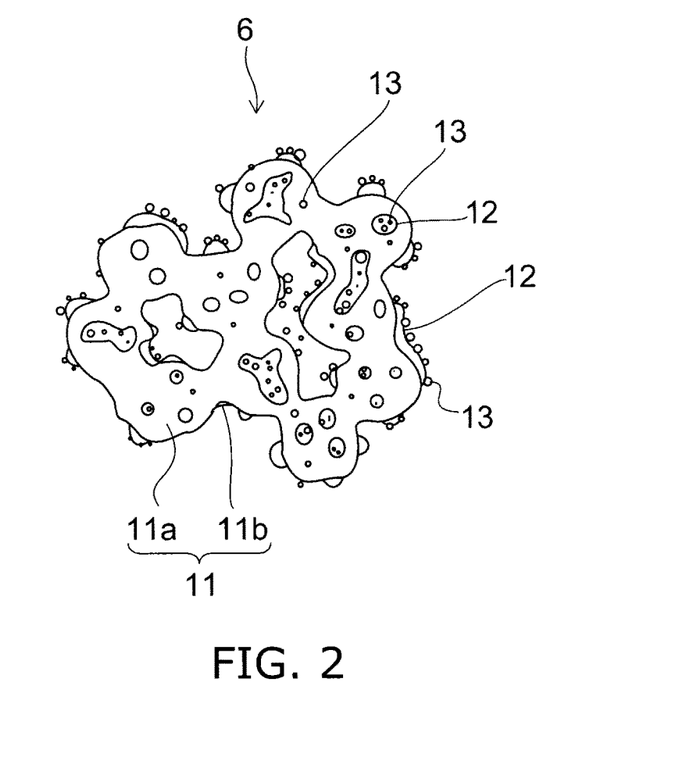
FIG. 2 is a schematic enlarged partial view for illustrating a second electrode.

The second electrode 6 is provided on the transparent electrode 5 on the central side of the second substrate 4. FIG. 2 is a schematic enlarged partial view for illustrating the second electrode 6.

As shown in FIG. 2, the second electrode 6 includes a base 11, a supporter 12, and a sensitizing dye 13.

The base 11 is a porous body, and includes a plurality of particle-like portions 11a and a necking portion 11b provided between a particle-like portion 11a and a particle-like portion 11a.

In this case, particle-like portions 11a are joined via the necking portion 11b.

The average particle size (average diameter dimension) of the particle-like portion 11a may be, for example, approximately 1 to 100 nm, preferably approximately 2 to 30 nm.

The surface of the base 11 is loaded with the sensitizing dye 13 via the supporter 12 or directly.

In this case, the sensitizing dye 13 is loaded mainly on the supporter 12. The supporter 12 is preferably a coating unit provided on the surface of a tungsten oxide powder. By providing the coating unit, the adsorbability (supportability) of the dye can be improved.

Therefore, if the surface area of the base 11 is too small, the power generation efficiency may be reduced.

According to the findings obtained by the inventors, the specific surface area of the base 11 is preferably 5 $m^2$/gw or more, more preferably 15 $m^2$/gw or more.

Since particle-like portions 11a are joined via the necking portion 11b, the movement of electrons from the sensitizing dye 13 can be made smooth.

The base 11 may contain tungsten oxide ($WO_3$) or a tungsten oxide composite. The electrode material for a battery described in the first embodiment described above is preferably used as the tungsten oxide ($WO_3$).

The tungsten oxide composite may be, for example, tungsten oxide containing an element such as N, Ti, Mn, Fe, Pd, Pt, Cu, Ag, Al, and Ce in an amount of approximately 0.01 mass % to 2 mass %. However, the element contained in the tungsten oxide is not limited to those illustrated but may be changed as appropriate.

Here, if the base 11 contains only tungsten oxide or a tungsten oxide composite, the supportability of the sensitizing dye 13 may be reduced. Accordingly, the amount of the sensitizing dye 13 loaded on the second electrode 6 may be decreased to reduce the power generation efficiency or the electricity storage function.

In view of this, in the solar cell 1 according to the embodiment, the supporter 12 for supporting the sensitizing dye 13 is provided.

The supporter 12 is provided on the surface of the base 11.

The supporter 12 may be provided such that supporters 12 are away from one another (in an island configuration) as illustrated in FIG. 2, or may be provided in a film form so as to cover the surface of the base 11. The supporter 12 is preferably a coating unit provided on part or the whole of the surface of a tungsten oxide powder. When the supporter 12 is provided as a coating unit on a tungsten oxide powder beforehand, the capability of each piece of tungsten oxide powder to support the dye can be improved.

In view of the simplicity of manufacturing, it is preferable to form a coating unit that forms the supporter 12 after the base 11 made of a tungsten oxide powder or a tungsten oxide composite is provided.

The supporter 12 may contain one of a metal oxide, silicon oxide ($SiO_2$), a metal nitride, and silicon nitride.

Examples of the metal oxide include $Y_2O_3$, $TiO_2$, ZnO, $SnO_2$, $ZrO_2$, MgO, $Al_2O_3$, $CeO_2$, $Bi_2O_3$, $Tm_2O_3$, $Mn_3O_4$, $Ta_2O_5$, $Nb_2O_5$, $La_2O_3$, ITO, and the like. Examples of the nitride include nitrides of these metals.

In this case, the supporter 12 may contain a combination of metal oxides, silicon oxide, metal nitrides, and silicon nitride of the above.

Here, metal oxides and silicon oxide have insulating properties. Therefore, if the thickness dimension of the supporter 12 is set too thick, the movement of electrons from the sensitizing dye 13 to the base 11 may be inhibited. If the thickness dimension of the supporter 12 is set too thin, it may be difficult to support the sensitizing dye 13.

According to the findings obtained by the inventors, the thickness dimension of the supporter 12 is preferably set not less than 0.5 nm and not more than 10 nm. 2 nm or less is more preferable. Also for the nitride, the thickness dimension is preferably 10 nm or less in view of the movement of electrons.

Figure 3:
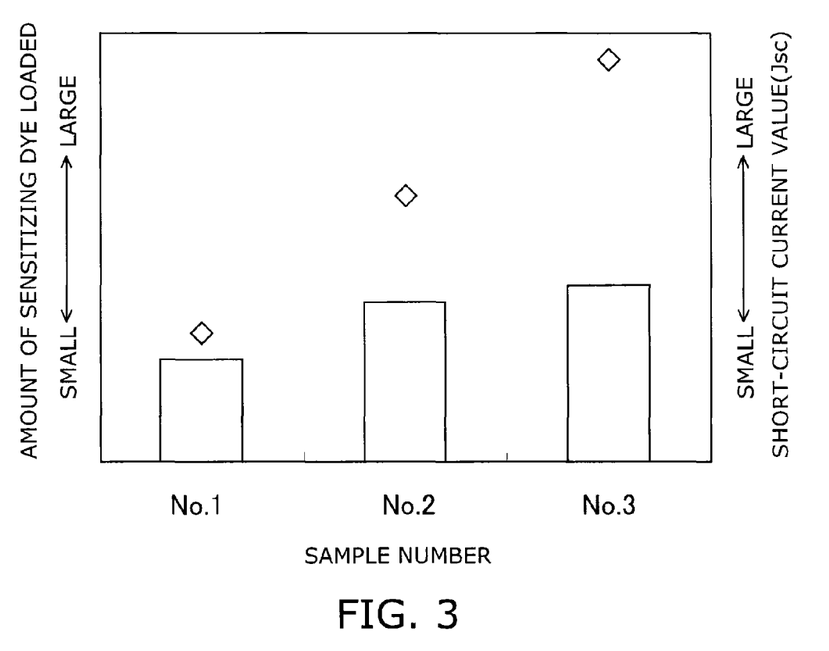
FIG. 3 is a schematic graph for illustrating effects in a case where a supporter is provided.

FIG. 3 is a schematic graph for illustrating effects in the case where the supporter 12 is provided.

The bar graph in the drawing shows the amount of the sensitizing dye loaded, and the square marks express the short-circuit current value.

The short-circuit current is the current flowing through the solar cell 1. Therefore, the larger the short-circuit current value is, the higher the power generation efficiency is.

What is illustrated in FIG. 3 is the case where the base 11 that is a porous body is formed of tungsten oxide and the sensitizing dye 13 is N719, which is a ruthenium (Ru)-based dye.

The sample No. 1 is the case where the supporter 12 is not provided, the sample No. 2 is the case where the supporter 12 formed of $TiO_2$ is provided, and the sample No. 3 is the case where the supporter 12 formed of $Y_2O_3$ is provided.

As can be seen from FIG. 3, by providing the supporter 12, the amount of the sensitizing dye 13 loaded can be increased.

Since the amount of the sensitizing dye 13 loaded can be increased by providing the supporter 12, the short-circuit current value can be increased.

That is, the power generation efficiency of the solar cell 1 can be improved by providing the supporter 12.

Furthermore, by providing the supporter 12 formed of $Y_2O_3$, the amount of the sensitizing dye 13 loaded and the short-circuit current value can be further increased, and thus the power generation efficiency of the solar cell 1 can be further improved.

Next, referring to FIG. 1 again, the sensitizing dye 13, the electrolytic solution 7, the sealing unit 8, etc. are illustrated.

As the sensitizing dye 13, a dye having a desired light absorption band and a desired absorption spectrum required for the solar cell 1 may be selected as appropriate. The sensitizing dye 13 may be, for example, an inorganic dye such as a ruthenium-based dye, an organic dye such as a coumarin-based dye, or the like.

The electrolytic solution 7 is provided inside the sealing unit 8. The electrolytic solution 7 may be, for example, an electrolytic solution containing iodine. As the electrolytic solution 7, for example, a solution in which lithium iodide and iodine are dissolved in a solvent such as acetonitrile may be illustrated.

The sealing unit 8 is provided between the first substrate 2 and the second substrate 4, and seals a peripheral portion of the first substrate 2 and a peripheral portion of the second substrate 4.

That is, the sealing unit 8 is provided so as to enclose the interior of the solar cell 1 along the peripheries of the first substrate 2 and the second substrate 4, and joins the first substrate 2 side and the second substrate 4 side. Thereby, the sealing unit 8 seals the interior of the solar cell 1.

The sealing unit 8 may contain a glass material.

The sealing unit 8 may be formed using, for example, a glass frit prepared in a paste form in which powder glass, a binder such as an acrylic resin, an organic solvent, etc. are mixed.

As the material of the powder glass, for example, vanadate-based glass, bismuth oxide-based glass, and the like may be illustrated.

The sealing unit 8 may be formed by, for example, applying a glass frit prepared in a paste form to the portion to be sealed and calcining the workpiece. After that, the sealing unit 8 is heated to melt the sealing unit 8 to perform sealing. For example, the formed sealing unit 8 is irradiated with laser light, and the portion irradiated with laser light of the sealing unit 8 is melted; thereby, sealing can be performed.

Here, if the sealing unit 8 and the first electrode 3 are joined by melting and the sealing unit 8 and the transparent electrode 5 are joined by melting, the first electrode 3 and the transparent electrode 5 may deteriorate.

For example, in the case where the first electrode 3 is formed of a metal or the like, the first electrode 3 may experience oxidation or the like to cause a variation in the resistance value etc.

In the case where the transparent electrode 5 is formed of ITO or the like, the transparent electrode 5 may experience deterioration or the like to cause a variation in the resistance value etc.

Furthermore, the adhesion, moistureproofness, bonding strength, etc. between the sealing unit 8 and the first electrode 3 and between the sealing unit 8 and the transparent electrode 5 may be reduced.

Hence, in the embodiment, the first bonding unit 9 is provided between one end of the sealing unit 8 and the first electrode 3, and the second bonding unit 10 is provided between the other end of the sealing unit 8 and the transparent electrode 5; thereby, the deterioration of the first electrode 3 and the transparent electrode 5 when the sealing unit 8 is heated is suppressed.

The first bonding unit 9 is shaped like a film, and is provided on a position facing the end surface of the sealing unit 8 of the first electrode 3.

The second bonding unit 10 is shaped like a film, and is provided on a position facing the end surface of the sealing unit 8 of the transparent electrode 5.

The first bonding unit 9 and the second bonding unit 10 are formed of a material that can suppress the deterioration of the first electrode 3 and the transparent electrode 5 when the sealing unit 8 is joined by melting. A material with good adhesion, moistureproofness, bonding strength, etc. to the sealing unit 8 is preferably used. Considering that laser light is applied when the sealing unit 8 is melted, a material that absorbs little light at wavelengths of 700 nm or more is preferably used.

For example, the first bonding unit 9 and the second bonding unit 10 may be formed of an oxide such as $SiO_2$, $Al_2O_3$, and $TiO_2$, a nitride such as SiN and AlN, an oxynitride such as SiON, or the like. In this case, in view of moistureproofness, the first bonding unit 9 and the second bonding unit 10 are preferably formed of a nitride.

The power generation efficiency and the electricity storage function were measured for the solar cells (dye-sensitized solar cells) of the samples No. 1, No. 2, and No. 3. Similar measurements were made for the sample No. 4 that is the same as the sample No. 2 except that the supporter is changed to $Al_2O_3$ and the sample No. 5 that is the same as the sample No. 2 except that the supporter is changed to MgO.

In the measurement of the power generation efficiency, the photoelectric conversion efficiency was measured by irradiating the fabricated dye-sensitized solar cell with light with an intensity of 1 kW/m$^2$ (an AM1.5 solar simulator).

In the measurement of the electricity storage function, the dye-sensitized solar cell was connected to a resistance of 510Ω, and the change in current on light irradiation and light interception was measured. Light with an intensity of 1 kW/m$^2$ (an AM1.5 solar simulator) was used as the light source. In order to investigate the electricity storage function, the solar cell was allowed to stand for 20 seconds in a dark place, and it was checked that the electricity output became zero, after which light irradiation was performed for 20 seconds and then light was intercepted. The discharge capacity from when the solar cell was irradiated with light to exhibit a maximum current value to when light was intercepted and the current value became 0 mA/cm$^2$ was found. Table 1 shows the results.

TABLE 1

| Sample | Supporter | Power generation efficiency (%) | Electricity storage function (C/m$^2$) |
|---|---|---|---|
| No. 1 | None | 0.6 | 40 |
| No. 2 | TiO$_2$ | 1.1 | 190 |
| No. 3 | Y$_2$O$_3$ | 1.2 | 210 |
| No. 4 | Al$_2$O$_3$ | 1.0 | 170 |
| No. 5 | MgO | 1.0 | 160 |

No. 2 to No. 5 in which the supporter is provided have improved the power generation efficiency and the electricity storage function than No. 1 in which the supporter is not provided.

Fourth Embodiment

Figure 4:
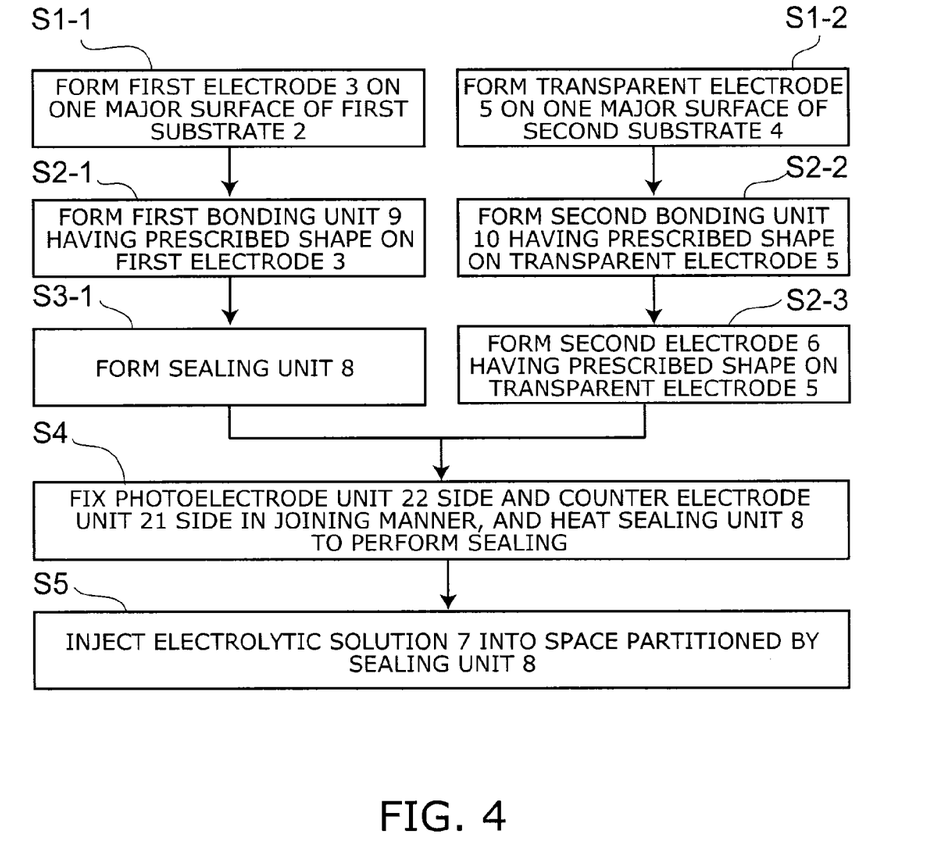
FIG. 4 is a flow chart for illustrating a method for manufacturing a solar cell according to a fourth embodiment.

FIG. 4 is a flow chart for illustrating a method for manufacturing a solar cell according to a fourth embodiment.

Figure 5:
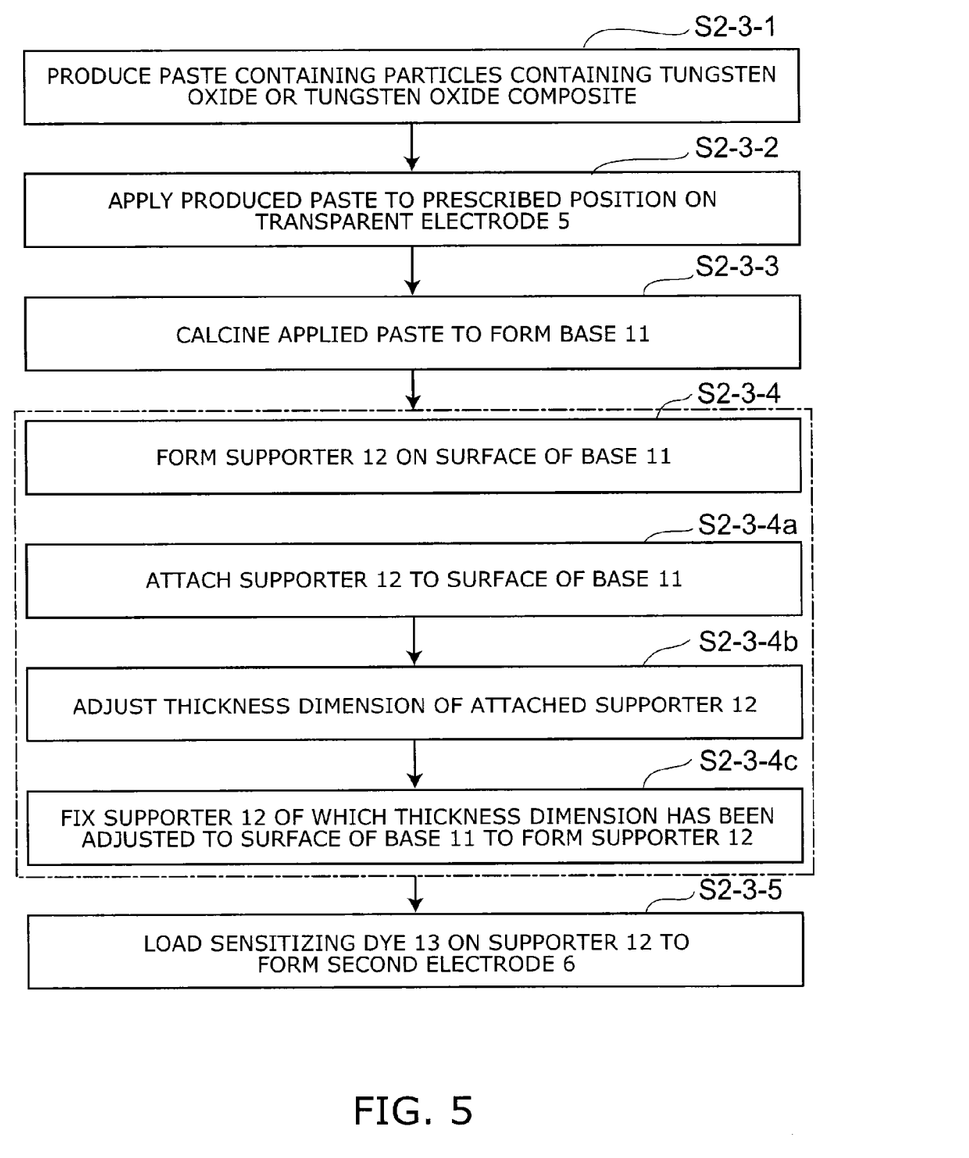
FIG. 5 is a flow chart for illustrating a formation of a second electrode.

FIG. 5 is a flow chart for illustrating the formation of the second electrode 6.

As shown in FIG. 4, on the counter electrode unit 21 side, first, the first electrode 3 is formed on one major surface of the first substrate 2 (step S1-1).

For example, the first electrode 3 may be formed using various physical vapor deposition (PVD) methods such as the vacuum deposition method and the sputtering method, various chemical vapor deposition (CVD) methods, the sol-gel method, or the like.

Next, the first bonding unit 9 having a prescribed shape is formed on the first electrode 3 (step S2-1).

For example, the first bonding unit 9 having a prescribed shape may be formed by combining various physical vapor deposition methods such as the vacuum deposition method and the sputtering method, various chemical vapor deposition methods, the sol-gel method, etc., and lithography technique, etching technique, etc.

Next, the sealing unit 8 is formed (step S3-1).

The sequence of forming the sealing unit 8 may be as follows, for example.

First, a glass frit prepared in a paste form in which powder glass, a binder such as an acrylic resin, an organic solvent, etc. are mixed is applied onto the first bonding unit 9 using the screen printing method, the dispensing method, or the like.

Next, the applied glass frit is calcined using a muffle furnace or the like to form the sealing unit 8.

On the photoelectrode unit 22 side, first, the transparent electrode 5 is formed on one major surface of the second substrate 4 (step S1-2).

Next, the second bonding unit 10 having a prescribed shape is formed on the transparent electrode 5 (step S2-2).

The method for forming the transparent electrode 5 and the second bonding unit 10 may be, for example, similar to the method for forming the first electrode 3 and the first bonding unit 9 described above.

Next, the second electrode 6 having a prescribed shape is formed on the transparent electrode 5 (step S2-3).

As shown in FIG. 5, the sequence of forming the second electrode 6 may be as follows, for example.

First, the base 11 containing tungsten oxide or a tungsten oxide composite is formed in the following manner.

A paste containing particles containing tungsten oxide or a tungsten oxide composite is produced (step S2-3-1).

The paste contains particles containing tungsten oxide or a tungsten oxide composite, a binder, and a solvent. Assuming that the total amount of the particles containing tungsten oxide or a tungsten oxide composite, the binder, and the solvent is 100 wt %, the amount of the particles containing tungsten oxide or a tungsten oxide composite is preferably in a range of 5 to 50 wt %, and the amount of the binder is preferably in a range of 3 to 30 wt %. In these ranges, it is easy to adjust the viscosity (25° C.) of the paste to a range of 800 to 10,000 cps. When the paste viscosity is 800 to 10,000 cps, it is easy to form the base 11 by coating technique such as the printing method.

The binder is preferably an organic binder with a pyrolysis rate at 500° C. of 99.0% or more. When the binder can be pyrolized at a temperature of 500° C. or less, a glass substrate etc. can be prevented from being damaged. As such a binder, an organic binder such as ethyl cellulose and polyethylene glycol is given. As the solvent, an alcohol, an organic solvent, pure water, etc. are given. As the organic solvent, EC Vehicle (manufactured by Nisshin Kasei Co., Ltd.) is illustrated.

For example, a paste is produced by mixing a particle powder containing tungsten oxide or a tungsten oxide composite and having an average particle size of approximately 30 nm (e.g. a nanoparticle powder of tungsten oxide with an average particle size of approximately 30 nm), a binder such as ethyl cellulose, an organic solvent, etc. A paste can be produced by performing stirring-defoaming for approximately not less than 5 minutes and not more than 20 minutes.

Then, the produced paste is applied to a prescribed position on the transparent electrode 5 (step S2-3-2).

That is, the produced paste is applied to the region where the second electrode 6 will be provided.

The application of the paste may be performed using, for example, the screen printing method.

At this time, the thickness dimension of the applied paste may be set to 1 μm or more, for example approximately 5 to 150 μm. By adjusting the paste viscosity in the above way beforehand, the thickness of the base 11 can be adjusted by performing a printing process and a drying process repeatedly multiple times.

Then, the applied paste is calcined to form the base 11 (step S2-3-3).

At this time, particles contained in the paste fuse together, and thereby particles are joined via the necking portion 11b. Thus, the base 11 that is a porous body is formed.

The calcination of the applied paste may be performed by heating at 200 to 500° C., for example, at 450° C. for approximately 30 minutes in a muffle furnace. When the calcination temperature can be set to 500° C. or less, the second substrate 4 etc. are prevented from being damaged. The temperature may be rapidly raised at a speed of 100°

C./h or more to pyrolize the binder at once; thereby, the porous base 11 is obtained efficiently.

Next, the supporter 12 is formed on the surface of the base 11 (step S2-3-4).

Herein, the case where the supporter 12 made of $Y_2O_3$ is formed is illustrated as an example.

First, the supporter 12 is attached to the surface of the base 11 (step S2-3-4-a).

For example, the second substrate 4 on which the base 11 is formed is immersed in an yttrium nitrate aqueous solution; thereby, the supporter 12 made of $Y_2O_3$ is attached to the surface of the base 11.

In this case, the concentration of the yttrium nitrate aqueous solution may be approximately 40 mmol, the temperature of the yttrium nitrate aqueous solution may be approximately 70° C., and the immersion time may be approximately 1 hour.

Next, the thickness dimension of the attached supporter 12 is adjusted (step S2-3-4-b).

As described above, if the thickness dimension of the supporter 12 is too thick, the movement of electrons from the sensitizing dye 13 to the base 11 may be inhibited.

In view of this, the surplus supporter 12 attached is removed to make the thickness dimension of the supporter 12 not less than 0.5 nm and not more than 10 nm.

The removal of the surplus supporter 12 attached may be performed by, for example, taking out the second substrate 4 with the supporter 12 attached from the yttrium nitrate aqueous solution and cleaning it with ethyl alcohol or the like.

Next, the supporter 12 of which the thickness dimension has been adjusted is fixed to the surface of the base 11 to form the supporter 12 (step S2-3-4-c).

For example, the second substrate 4 to which the supporter 12 of which the thickness dimension has been adjusted is attached is dried using nitrogen gas or the like, and the attached supporter 12 is calcined; thereby, the supporter 12 is fixed to the surface of the base 11.

The calcination of the attached supporter 12 may be performed by, for example, heating at 450° C. for approximately 30 minutes in a muffle furnace.

Thus, the supporter 12 can be formed on the surface of the base 11. By forming the supporter 12 on the surface of the base 11, a coating unit is formed. The method for forming the supporter 12 illustrated herein is a method in which the base 11 is formed using a tungsten oxide powder and then the sol-gel method is used to form a supporter. The embodiment is not limited to this method, and it is also possible to use a tungsten oxide powder on which a coating unit is formed beforehand, using the electrode material for a battery or the electrode material paste for a battery illustrated in the first embodiment or the second embodiment described above.

Next, the sensitizing dye 13 is loaded on the supporter 12 to form the second electrode 6 (step S2-3-5).

For example, first, a solution in which the sensitizing dye 13 is dissolved in a solvent such as ethyl alcohol is produced. Next, the second substrate 4 on which the supporter 12 is formed is immersed in this solution to load the supporter 12 with the sensitizing dye 13.

In this case, the sensitizing dye 13 is loaded mainly on the supporter 12, but part of the sensitizing dye 13 is loaded on the surface of the base 11.

Next, the photoelectrode unit 22 side and the counter electrode unit 21 side are fixed so as to be joined, and the sealing unit 8 is heated to perform sealing (step S4).

For example, laser light is applied from the photoelectrode unit 22 side toward the sealing unit 8 to heat the sealing unit 8; thereby, sealing can be performed.

Next, the electrolytic solution 7 is injected into the space partitioned by the sealing unit 8 (step S5).

For example, a not-shown hole penetrating through the first substrate 2 and the first electrode 3 is formed beforehand; after sealing, the electrolytic solution 7 is injected through the hole, and the hole is sealed after the injection of the electrolytic solution 7.

Thus, the solar cell 1 can be manufactured.

Although the case where the sealing unit 8 is formed on the counter electrode 21 side is illustrated in the above, the sealing unit 8 may be formed on the photoelectrode unit 22 side.

Although the case where the electrolytic solution 7 is injected after sealing is performed is illustrated in the above, it is also possible to inject the electrolytic solution 7 into the inside of the sealing unit 8 before sealing is performed.

The order in which the components described above are formed may be altered as appropriate. For example, the second bonding unit 10 may be formed after the second electrode 6 is formed.

Fifth Embodiment

Next, a storage battery is described as a fifth embodiment.

The storage battery has the function of storing electricity, that is, has an electricity storage function. The basic structure is the same as the dye-sensitized solar cell shown in FIG. 1. The difference is that the sensitizing dye 13 is not used in the second electrode 6. The fifth embodiment is a battery exclusively for the electricity storage function, and therefore does not need the sensitizing dye 13. In addition, since the sensitizing dye 13 is not needed, also sunlight is not needed and therefore the substrate 4 does not need to be transparent.

Next, storage batteries of the samples No. 6, No. 7, No. 8, No. 9, and No. 10 were prepared that are the same as the samples No. 1, No. 2, No. 3, No. 4, and No. 5 mentioned above, respectively, except that the sensitizing dye 13 is not used.

The electricity storage capability was measured for the storage batteries. As the measurement method, an external power source was used, charging was performed on the storage battery at 0.74 V for 640 seconds, and the electricity storage capacity was calculated from the value of current flowing through a resistance of 510Ω connected thereafter. Table 2 shows the results.

TABLE 2

| Sample | Supporter | Electricity storage function (C/m$^2$) |
|---|---|---|
| No. 6 | None | 1230 |
| No. 7 | TiO$_2$ | 1350 |
| No. 8 | Y$_2$O$_3$ | 1380 |
| No. 9 | Al$_2$O$_3$ | 1330 |
| No. 10 | MgO | 1240 |

An improvement in the electricity storage function was seen by providing the supporter. This is presumed to be because the electrical conductivity between pieces of tungsten oxide powder has been improved and the film adhesion strength (necking properties) has been improved.

The embodiments illustrated above can provide a solar cell that can improve the power generation efficiency or the electricity storage effect and a method for manufacturing the same.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. An electrode material for a battery, the electrode material comprising a base at least partially covered by a plurality of coating units, wherein:
   the base comprises a tungsten oxide powder or a tungsten oxide composite powder, and the base is at least partially covered by more than one a coating unit comprising a metal oxide and optionally at least one selected from the group consisting of silicon oxide, a metal nitride, and silicon nitride,
   wherein:
   a thickness of the coating unit is not less than 0.5 nm and not more than 2 nm;
   the tungsten oxide powder or the tungsten oxide composite powder has a BET surface area of 5 $m^2/g$ or more; and
   the metal oxide comprises at least one selected from the group consisting of $Y_2O_3$, $TiO_2$, $ZnO$, $ZrO_2$, $MgO$, $Al_2O_3$, $CeO_2$, $Tm_2O_3$, $Bi_2O_3$, $Mn_3O_4$, $Ta_2O_5$, $Nb_2O_5$ and $La_2O_3$.

2. The electrode material of claim 1, which is adapted to function in a solar cell or a storage battery.

* * * * *